United States Patent
Good et al.

(10) Patent No.: US 10,788,806 B2
(45) Date of Patent: Sep. 29, 2020

(54) INITIALIZING INDIVIDUAL EXPOSURE FIELD PARAMETERS OF AN OVERLAY CONTROLLER

(71) Applicant: GLOBALFOUNDRIES Inc., Grand Cayman (KY)

(72) Inventors: Richard P. Good, Saratoga Springs, NY (US); Eyup Cinar, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 233 days.

(21) Appl. No.: 16/029,759

(22) Filed: Jul. 9, 2018

(65) Prior Publication Data

US 2020/0012252 A1    Jan. 9, 2020

(51) Int. Cl.
| *G05B 19/401* | (2006.01) |
| *G06F 30/20* | (2020.01) |
| *G03F 1/00* | (2012.01) |
| *H01L 21/266* | (2006.01) |

(52) U.S. Cl.
CPC .. *G05B 19/401* (2013.01); *G05B 2219/35506* (2013.01); *G05B 2219/45026* (2013.01)

(58) Field of Classification Search
CPC .... G03F 7/70633; G03F 7/70433; G03F 1/00; G03F 7/70466; G05B 2219/37224; G05B 2219/45031; G05B 19/401; G05B 2219/45026; G05B 2219/35506; G06F 30/20

USPC .......................................... 700/120, 121, 109
See application file for complete search history.

(56) References Cited

U.S. PATENT DOCUMENTS

| 7,233,835 | B2 | 6/2007 | Good et al. |
| 9,746,841 | B2 | 8/2017 | Zou |
| 2015/0241790 | A1 | 8/2015 | Pierson et al. |
| 2017/0235233 | A1* | 8/2017 | Lee ............. G03F 7/70633 355/67 |

\* cited by examiner

*Primary Examiner* — Michael J Brown
(74) *Attorney, Agent, or Firm* — Amerson Law Firm, PLLC

(57) ABSTRACT

A method for initializing individual exposure field parameters of an overlay controller is disclosed including initializing a first control thread having a first context associated with a first product type, wherein a first layout of first exposure fields is defined for the first product type for processing in a stepper. The method further includes remapping a set of previous control state data for a set of control threads associated with other product types different than the first product type into the first layout. The other product types have layouts of second exposure fields different than the first layout. An initial set of control state data for the first control thread associated with the first product type is generated using the remapped previous control state data. The stepper is configured for processing a first substrate of the first product type using the initial set of control state data.

19 Claims, 4 Drawing Sheets

INITIALIZING INDIVIDUAL EXPOSURE FIELD PARAMETERS OF AN OVERLAY CONTROLLER

BACKGROUND

1. Field of the Disclosure

Generally, the present disclosure relates to the field of semiconductor processing, and, in particular, to techniques for initializing individual exposure field parameters of an overlay controller.

2. Description of the Related Art

Integrated circuits formed on semiconductor wafers typically include a large number of circuit elements, which form an electric circuit. In addition to active devices such as, for example, field effect transistors and/or bipolar transistors, integrated circuits may include passive devices such as resistors, inductors and/or capacitors.

The formation of IC structures on a wafer is usually facilitated by lithographic processes used to transfer a pattern of a reticle (mask, both terms are used interchangeably herein) to a wafer. Patterns may be formed from a photoresist layer disposed on the wafer by passing light energy through a mask having an arrangement to image the desired pattern onto the photoresist layer. As a result, the pattern is transferred to the photoresist layer. In areas where the photoresist is sufficiently exposed, and after a development cycle, the photoresist material becomes soluble such that it may be removed in order to selectively expose an underlying layer (e.g., a semiconductor layer, a metal or metal-containing layer, a dielectric layer, a hard mask layer, etc.). Portions of the photoresist layer not exposed to a threshold amount of light energy will not be removed and serve to protect the underlying layer during further processing of the wafer (e.g., etching exposed portions of the underlying layer, implanting ions into the wafer, etc.). Thereafter, the remaining portions of the photoresist layer may be removed.

One of the key parameters in the photolithography process involves accurate overlay positioning, i.e., the process of aligning pattern features in a current layer to previously-patterned features in a previously-formed layer. Overlay is traditionally measured with relatively large test structures which are located in the scribe lines located between production die formed on a semiconductor wafer. An overlay controller provides correction parameters to the stepper to increase alignment accuracy.

A run-to-run process control strategy, commonly referred to as advanced process control (APC), has been employed to control the tool parameters of a stepper for overlay control. Such controllers typically employ a threaded approach, where each control thread represents a particular context defined by the particular process operation, product, stepper ID, reticle ID, etc. Each control thread represents a virtual controller that generates recipe parameters for the given context using a process model and measurement data (pre-process and post-process). From this information and the process model, the process controller determines a controller state or process state that describes the effect of the process or processes under consideration on the specific context and generates tool parameters for a current run of the stepper.

One difficulty arises when a new context arises (e.g., a new context for a new product or an existing context for which the previous metrology data is stale). The current state of the context may not reliably be estimated due to missing data or aged data. Such new contexts are typically initialized by running pilot substrates ahead in the process flow to obtain sufficient data to estimate the "actual" control state and to perform a control operation on the basis of data obtained by the pilot substrates. However, the processing of pilot substrates may be extremely costly and time consuming, thereby reducing throughput, tool utilization and, finally, profitability. Moreover, since the pilot substrates are processed without benefit of an APC controller, they often require rework.

The present invention is directed to a method and system that may solve, or at least reduce, some or all of the aforementioned problems.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to techniques for initializing individual exposure field parameters of an overlay controller. One illustrative method includes initializing a first control thread having a first context associated with a first product type. A first layout of first exposure fields is defined for the first product type for processing in a stepper. The method further includes remapping a set of previous control state data for a set of control threads associated with other product types different than the first product type into the first layout. The other product types have layouts of second exposure fields different than the first layout. An initial set of control state data is generated for the first control thread associated with the first product type using the remapped previous control state data. The stepper is configured for processing a first substrate of the first product type using the initial set of control state data.

An illustrative system disclosed herein includes a stepper for exposing a substrate and an overlay controller to initialize a first control thread having a first context associated with a first product type. A first layout of first exposure fields is defined for the first product type for processing in a stepper. A set of previous control state data for a set of control threads associated with other product types different than the first product type is remapped into the first layout, wherein the other product types have layouts of second exposure fields different than the first layout. An initial set of control state data for the first control thread associated with the first product type is generated using the remapped previous control state data, and the stepper is configured for processing a first substrate of the first product type using the initial set of control state data.

BRIEF DESCRIPTION OF THE DRAWINGS

The disclosure may be understood by reference to the following description taken in conjunction with the accompanying drawings, in which like reference numerals identify like elements, and in which.

Figure 1:
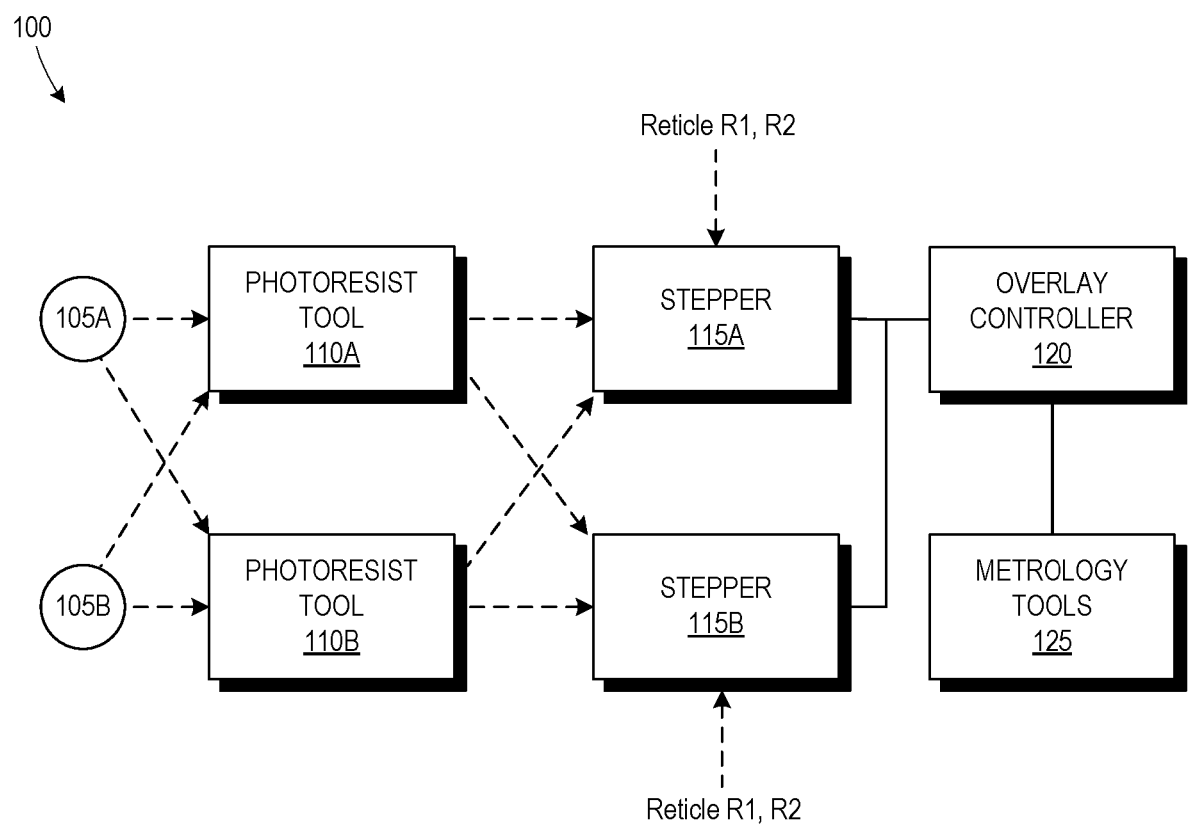
FIG. 1 is a block diagram of a system for performing exposure operations on wafers by measuring wafer distortion and correcting overlay based on the wafer distortion, in accordance with some embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

FIG. 1 is a block diagram of a system 100 for performing resist operations on substrates 105A, 105B (e.g., wafers), in accordance with some embodiments. The system 100 includes photoresist tools 110A, 110B for applying a photoresist layer to the substrates 105A, 105B and steppers 115A, 115B for patterning the photoresist layer using a reticle. For a given process operation (e.g., layer), different reticles may be used (e.g., reticles R1, R2). The steppers 115A, 115B are controlled by an overlay controller 120 using an APC algorithm. Metrology tools 125, for instance optical instruments for estimating a line width of resist features, are provided and operatively connected to the overlay controller 120 so as to provide measurement results. Thus, the overlay controller 120 and the metrology tools 125 establish a feedback control loop, in which current tool parameter settings for the steppers 115A, 115B are calculated on the basis of previously processed substrates.

Other metrology data may be provided by the stepper 115A, 115B itself. When a substrate 105A, 105B is loaded into a stepper 115A, 115B, alignment measurements may be taken using alignment marks present on the wafer that were formed by previous process operations. These alignment marks provide information regarding the previous layers of the substrate 105A, 105B. The raw alignment measurements may be laser scans of gratings of different pitches that create an interference pattern.

The dashed arrows in FIG. 1 represent the different possible flow paths of the substrates 105A, 105B though the tools 110A, 110B, 115A, 115B, and the different reticles R1, R2 that may be used. The overlay controller 120 employs control threads for each unique context, i.e., each combination of previous tool history (e.g., photoresist tool 110A, 110B, stepper 115A, 115B), product (e.g., substrate 105A, 105B), reticle R1, R2, etc. The overlay controller 120 calculates correction factors for the particular stepper 115A, 115B based on the unique context of the operation being performed and the control state associated with the context.

In a general process control scenario, a current control state is generated from metrology data associated with a particular one of the incoming substrates 105A, 105B. For example, the overlay controller 120 may compile alignment mark measurements across the entire substrate 105A or 105B to generate translation, rotation, and magnification correction factors. The correction factors represent the current state for the current substrate 105A or 105B. Techniques for generating the correction factors are known to those of ordinary skill in the art, so they are not described in greater detail herein to avoid obscuring the present subject matter. The current control state is combined with the previous control state in the overlay controller 120 to generate an updated control state. Various techniques, such as an exponentially weighted moving average Kalman filtering, maximum likelihood, etc., may be used to combine the current and previous control states.

However, in the case of a new thread that lacks measurement data due to missing or old measurement data, the previous control state may be missing or incomplete. Instead, measurement data from other threads may be used to populate the thread. The general equation for thread reconstruction is:

$$AB=Y,$$

where A represents the particular context, B represents the control state estimates, and Y represents the measurement data associated with the context. Measurement data from other contexts (e.g., same photoresist tool 110A, 110B and stepper 115A, 115B, but different substrate 105A, 105B) may be used to calculate the previous control state for the new thread so that it may be combined with the current control state to generate an updated control state, and the updated control state may be used to generate a control action for the associated stepper 115A, 115B.

Figure 2:
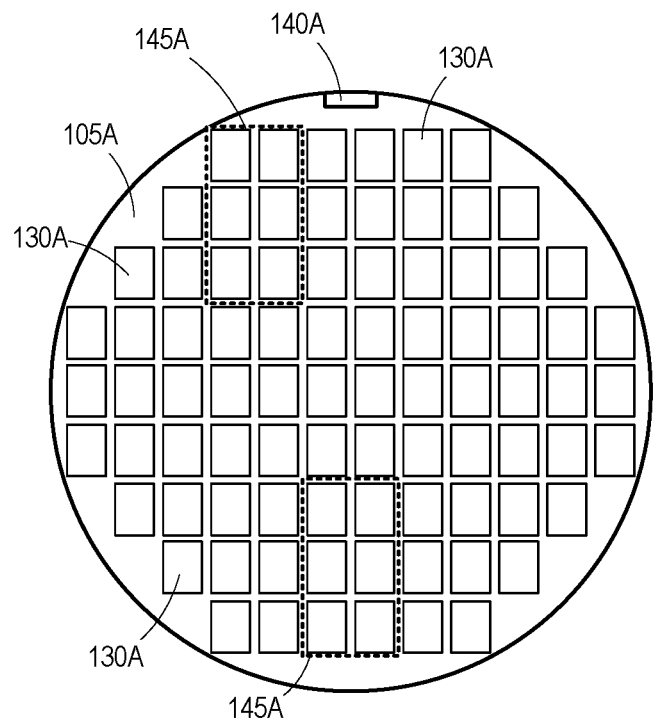
FIG. 2 is a simplified diagram of a prior art wafer illustrating exposure fields.
Figure 2:
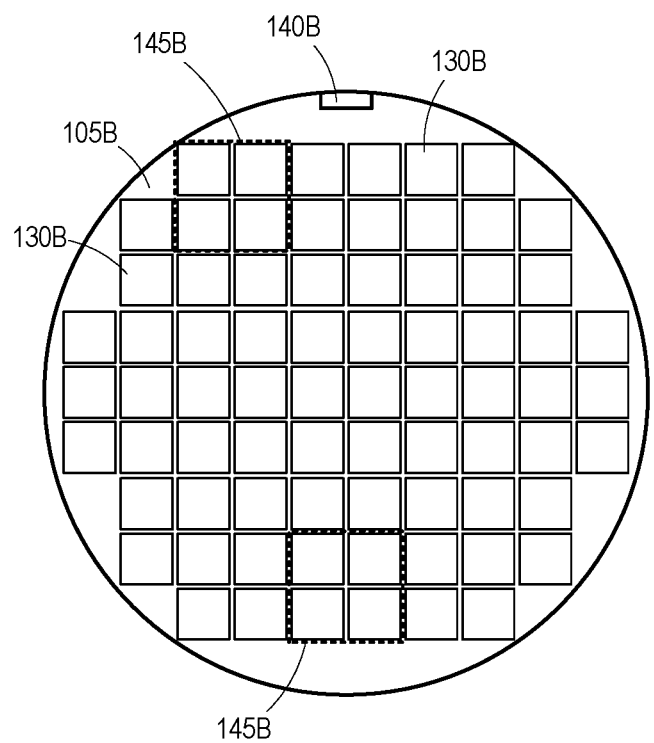

FIG. 2 depicts an illustrative embodiment of the two substrates 105A, 105B that may be subjected to exposure processes in the steppers 115A, 115B. A plurality of die 130A, 130B are formed above each wafer 105A, 105B. The die 130A, 130B define the area of the substrates 105A, 105B where production integrated circuit devices, e.g., microprocessors, ASICs, memory devices, will be formed. The size, shape and number of die 130A, 130B per substrate 105A, 105B depend upon the type of device under construction and the size of the substrate 105A, 105B. For example, the die 130A are smaller than the die 130B. Each substrate 105A, 105B may have an alignment notch 140A, 140B that is used to provide relatively rough alignment of the substrate 105A, 105B in the steppers 115A, 115B.

The exposure process performed on each substrate 105A, 105B is typically performed on a flash-by-flash basis as the substrate 105A, 105B is moved, or stepped, relative to a light source. During each step, the light source (not shown) in the stepper 115A, 115B projects light onto a given area of the substrate 105A, 105B, i.e., each flash is projected onto an exposure field 145A, 145B. The size of each exposure field 145A, 145B, as well as the number of die 130A, 130B within each exposure field 145A, 145B, may vary greatly by product. For example, the exposure field 145A includes six die 130A in a 2×3 pattern, while the exposure field 145B includes four die 130B in a 2×2 pattern.

In overlay control, individual correction factors may be provided for each exposure field 145A, 145B, referred to as correction per exposure (CPE) fields. Example CPE fields include:

CPE_WTRX: x translation
CPE_WTRY: y translation
CPE_FMAG: magnification (field magnification)
CPE_AMAG: asymmetric magnification
CPE_FROT: rotation
CPE_AROT: asymmetric rotation Since the products associated with the substrates 105A, 105B have different numbers, sizes, and positions of the exposure fields 145A, 145B, the CPE state data associated with the context that processed the substrate 105A does not directly correspond to the CPE state data associated with the context that processed the substrate 105B.

Figure 3A:
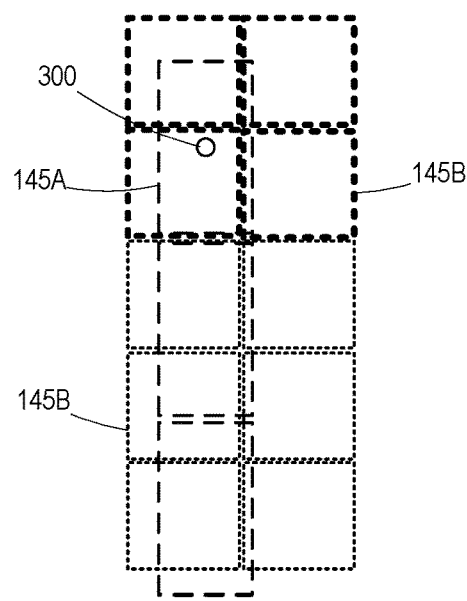
FIGS. 3A and 3B illustrate the remapping of exposure fields between different product types, in accordance with some embodiments.
Figure 3B:
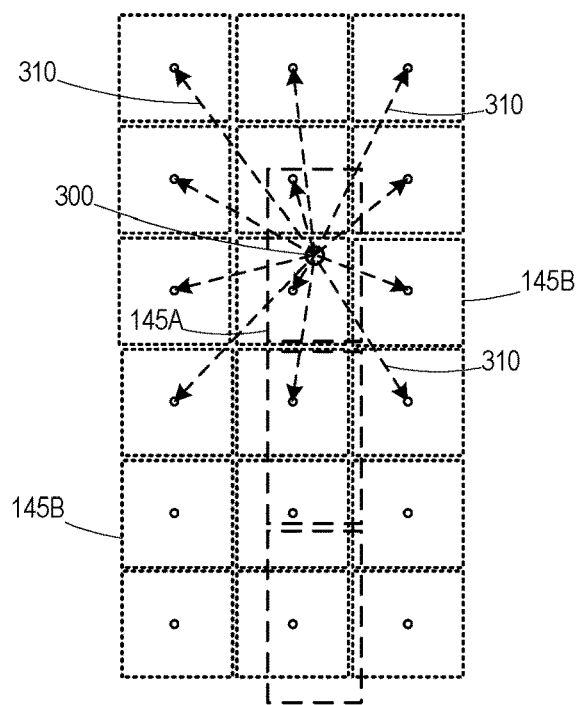

To allow the use of CPE state data from other threads, the CPE data from other product types is remapped to the exposure field space of the current product type associated with the new thread. FIGS. 3A, 3B illustrate the correspondence between the exposure fields 145A of Product A associated with the substrate 105A and the exposure fields 145B of Product B associated with the substrate 105B. The value for the particular CPE parameter represented by data point 300 for an exposure field 145A may be estimated using the values of the CPE parameter for the nearby exposure fields 145B. A mapping procedure is performed to map the data values for the CPE parameters from the Product B exposure field space to the Product A exposure field space.

In one embodiment shown in FIG. 3A, the data point 300 for the CPE parameter of a Product A exposure field 145A may be determined using an average of the CPE parameter for the k nearest neighbors (shown in bold).

$$DP = \frac{\sum_k DP_k}{K}$$

In another embodiment shown in FIG. 3B, the data point 300 for the CPE parameter may be determined using a distance weighted average based on all other fields or all fields within a given radius. The length of an arrow 310 is the distance d. The weight of the measured value of an exposure field 145B decreases with distance. For example, an exponential discounting factor, w, may be used:

$$w = e^{-md^2},$$

where m is a tuning parameter that governs how quickly the data is discounted. This function is known as a Gaussian radial basis function (RBF). If a particular radius is employed, data points with distances greater than a predetermined threshold may be ignored.

In yet another embodiment, the CPE data for the exposure fields 145B may be fit to a model, such as a polynomial model. The model may be employed to generate an estimated value for the exposure field 145A based on the location of the data point 300.

In some embodiments, the scan direction may also be used to filter the previous CPE state data. It has been noted that the y-translation factor (CPE_WTRY) correction factor is affected by scan direction (i.e., up to down or down to up). Thus, only CPE_WTRY data associated with the same scan direction as the exposure field 145A is used to generate the data point 300.

By incorporating the CPE state data from other threads and remapping the exposure fields, the previous control state for the current context may be estimated. The state estimate contributions come from the thread component matrix A:

$$\hat{B} = A^+ Y,$$

where each row of Y corresponds to an existing thread and $A^+$ represents an inversion or pseudo-inversion of the A matrix.

The state estimate may be represented as:

$$\hat{Y} = A_{new}\hat{B}$$

$$\hat{Y} = (A_{new}A^+)Y$$

$$\hat{Y} = \omega Y$$

Hence, the state estimates from the remapped CPE data are weighted by the sum of the observed states (ω). The influence that each measurement has on the predicted value is called the influence vector (or projection vector) ω. If a measurement has a large influence on the predicted state, then it has a large magnitude. In contrast, measurements with a small influence on the predicted state have a small magnitude.

The state estimate, $\hat{Y}$, generated using CPE data from other threads may be used as the basis for generating a control action for the current substrate 105A, 105B. The current state generated using the metrology data from the current substrate 105A may be combined with the state estimate, $\hat{Y}$, to update the control state and generate the control action.

Figure 4:
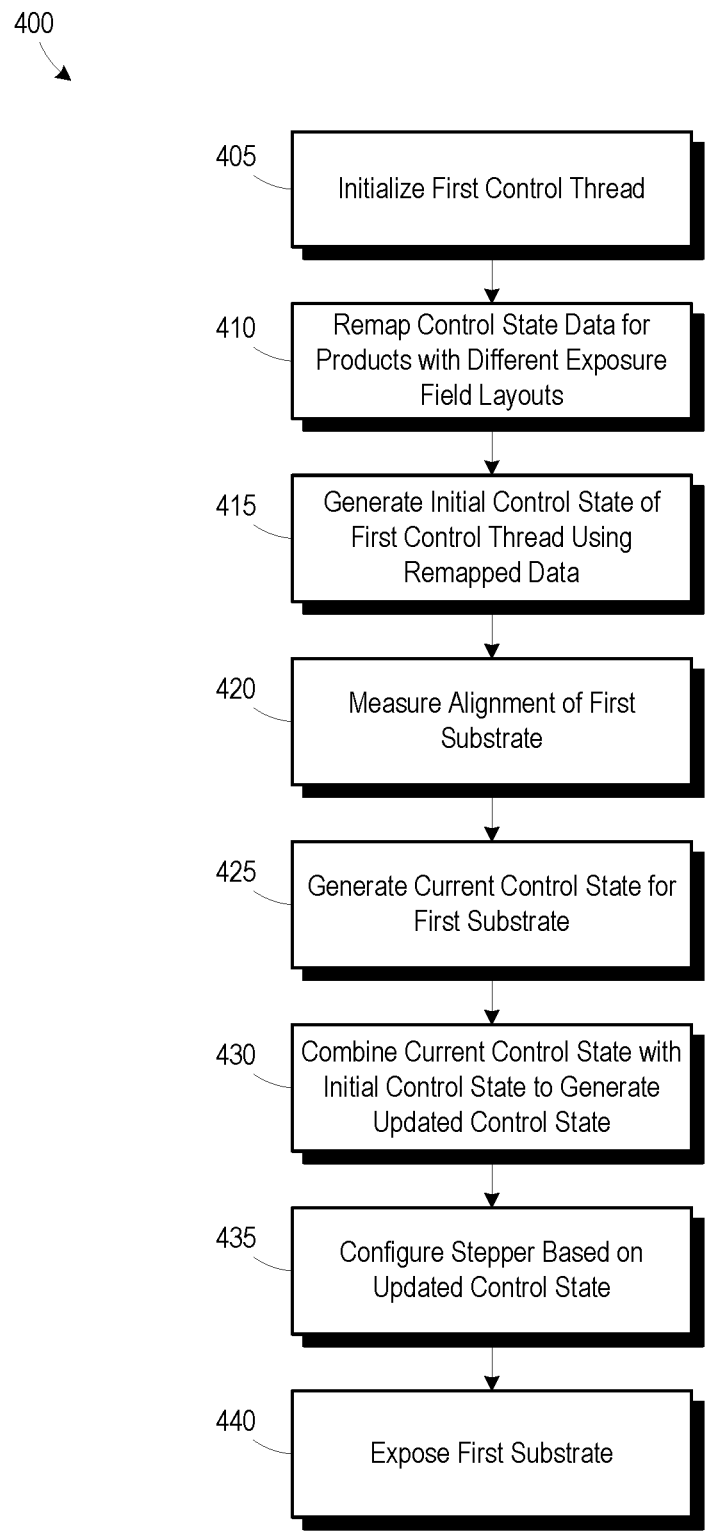
FIG. 4 is a flow diagram of one illustrative method for initializing an overlay controller, in accordance with some embodiments.

FIG. 4 is a flow diagram of one illustrative method 400 for initializing an overlay controller 120, in accordance with some embodiments. The elements of the method 400 may be performed by the overlay controller 120.

In method block 405, a first control thread is initialized. The first control thread may have no previous control state data or incomplete control state data. The first control thread has a first context associated with a first product type. A first layout of first exposure fields 145A is defined for the first product type.

In method block 410, control state data for a set of control threads associated with product types other than the first product type that have layouts of second exposure fields different than the first layout are remapped.

In method block 415, an initial set of control state data is generated for the first control thread using the remapped control state data. Each of the first exposure fields is associated with a subset of the initial set of control state data.

For example, the subset may include the correction factors associated with the exposure field.

In method block 420, the alignment of a first substrate is measured in the stepper 115A, 115B.

In method block 425, a current control state for the first substrate is generated based on the alignment data. For example, the current control state may include the correction parameters for each exposure field calculated based on the measured alignment.

In method block 430, the current control state may be combined with the initial control state to generate an updated control state. Various techniques, such as an exponentially weighted moving average, a Kalman filter, a maximum likelihood approach, etc., may be used to combine the current and previous control states.

In method block 435, the stepper 110A, 110B is configured using the updated control state.

In method block 440, the first substrate is exposed in the stepper 110A, 110B.

The remapping of the CPE data from other products described herein allows new control threads to be initialized, even when the layout of exposure fields is different. The initialization allows the overlay controller 120 to generate a control action for the first substrate in the new control thread without requiring the use of pilot wafers. This approach increases throughput and quality, while also reducing rework.

In some embodiments, certain aspects of the techniques described above may be implemented by one or more processors of a processing system executing software. The method 400 described herein may be implemented by executing software on a computing device, such as the overlay controller 120 of FIG. 1, however, such methods are not abstract in that they improve the operation of the stepper 110A, 110B and the quality of the fabricated substrates 105A, 105B. Prior to execution, the software instructions may be transferred from a non-transitory computer readable storage medium to a memory.

The software may include one or more sets of executable instructions stored or otherwise tangibly embodied on a non-transitory computer readable storage medium. The software can include the instructions and certain data that, when executed by one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    initializing a first control thread having a first context associated with a first product type, wherein a first layout of first exposure fields is defined for the first product type for processing in a stepper;
    remapping a set of previous control state data for a set of control threads associated with other product types different than the first product type into the first layout, wherein the other product types have layouts of second exposure fields different than the first layout and wherein remapping the set of previous control state data for the set of control threads comprises, for a selected exposure field of the first exposure fields in the first layout, averaging the set of previous control state data for a set of second exposure fields proximate the selected exposure field;
    generating an initial set of control state data for the first control thread associated with the first product type using the remapped previous control state data; and
    configuring the stepper for processing a first substrate of the first product type using the initial set of control state data.

2. The method of claim 1, further comprising exposing the first substrate of the first product type using the stepper configured with the initial set of control state data.

3. The method of claim 1, wherein the initial set of control state data comprises sets of model coefficients for correction factors for the first exposure fields.

4. The method of claim 3, wherein the correction factors comprise an x-translation factor, a y-translation factor, a magnification factor, an asymmetric magnification factor, a rotation factor, and an asymmetric rotation factor.

5. The method of claim 1, further comprising:
    generating a current set of control state data for the first substrate based on alignment measurement data for the first substrate;
    combining the current set of control state data with the initial set of control state data to generate an updated set of control state data; and
    configuring the stepper based on the updated set of control state data.

6. The method of claim 1, further comprising selecting the set of second exposure fields having distances from the selected exposure field less than a predetermined threshold.

7. The method of claim 1, wherein averaging the previous control state data comprises employing a distance weighted average.

8. The method of claim 1, wherein remapping the previous control state data for the set of control threads comprises:
generating a model of the previous control state data for each member of the set of control threads associated with the other product types across the second exposure fields; and
employing the model to generate control state data for each of the first exposure fields.

9. The method of claim 1, wherein a subset of the initial control state data for each of the first exposure fields comprises a set of model coefficients for a y-translation correction factor, each of the first and second exposure fields has an associated scan direction, and the method further comprises ignoring previous control state data for the y-translation correction factor for the second exposure fields having scan directions different than the first exposure field when remapping the previous control state data.

10. A system, comprising:
a stepper for exposing a substrate; and
an overlay controller to initialize a first control thread having a first context associated with a first product type, wherein a first layout of first exposure fields is defined for the first product type for processing in a stepper, remap a set of previous control state data for a set of control threads associated with other product types different than the first product type into the first layout, wherein the other product types have layouts of second exposure fields different than the first layout, generate an initial set of control state data for the first control thread associated with the first product type using the remapped previous control state data, wherein the overlay controller is to remap the set of previous control state data for the set of control threads by averaging the set of previous control state data for a set of second exposure fields proximate a selected exposure field of the first exposure fields and configure the stepper for processing a first substrate of the first product type using the initial set of control state data.

11. The system of claim 10, wherein the stepper is to expose the first substrate of the first product type after being configured with the initial set of control state data.

12. The system of claim 10, wherein the initial set of control state data comprises sets of model coefficients for correction factors for the first exposure fields.

13. The system of claim 12, wherein the correction factors comprise an x-translation factor, a y-translation factor, a magnification factor, an asymmetric magnification factor, a rotation factor, and an asymmetric rotation factor.

14. The system of claim 10, wherein the overlay controller is to generate a current set of control state data for the first substrate based on alignment measurement data for the first substrate, combine the current set of control state data with the initial set of state data to generate an updated set of control state data, and configure the stepper based on the updated set of control state data.

15. The system of claim 10, wherein the overlay controller is to select the set of second exposure fields having distances from the selected exposure field less than a predetermined threshold.

16. The system of claim 10, wherein the overlay controller is to average the previous control state data using a distance weighted average.

17. The system of claim 10, wherein the overlay controller is to remap the previous control state data for the set of control threads by generating a model of the previous control state data for each member of the set of control threads associated with the other product types across the second exposure fields and employing the model to generate control state data for each of the first exposure fields.

18. The system of claim 10, wherein a subset of the initial control state data for each of the first exposure fields comprises a set of model coefficients for a y-translation correction factor, each of the first and second exposure fields has an associated scan direction, and the overlay controller is to ignore control state data for the y-translation correction factor for the second exposure fields having scan directions different than the first exposure field when remapping the control state data.

19. A system, comprising:
a stepper for exposing a substrate; and
an overlay controller to initialize a first control thread having a first context associated with a first product type, wherein a first layout of first exposure fields is defined for the first product type for processing in a stepper, remap a set of previous control state data for a set of control threads associated with other product types different than the first product type into the first layout, wherein the other product types have layouts of second exposure fields different than the first layout, generate an initial set of control state data for the first control thread associated with the first product type using the remapped set of previous control state data, and configure the stepper for processing a first substrate of the first product type using the initial set of control state data, wherein a subset of the initial control state data for each of the first exposure fields comprises a set of model coefficients for a y-translation correction factor, each of the first and second exposure fields has an associated scan direction, and the overlay controller is to ignore control state data for the y-translation correction factor for the second exposure fields having scan directions different than the first exposure field when remapping the control state data.

* * * * *